(12) United States Patent
Coomer

(10) Patent No.: US 6,777,648 B2
(45) Date of Patent: Aug. 17, 2004

(54) METHOD AND SYSTEM TO MANUFACTURE STACKED CHIP DEVICES

(75) Inventor: Boyd L. Coomer, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 373 days.

(21) Appl. No.: 10/042,285

(22) Filed: Jan. 11, 2002

(65) Prior Publication Data

US 2003/0132527 A1 Jul. 17, 2003

(51) Int. Cl.[7] .............................................. B23K 26/00
(52) U.S. Cl. .............................. 219/121.85; 219/121.69
(58) Field of Search ........................ 219/121.85, 121.69, 219/121.65, 121.66, 121.67, 121.68

(56) References Cited

U.S. PATENT DOCUMENTS

| | | | |
|---|---|---|---|
| 5,355,102 A | * 10/1994 | Kornrumpf et al. | 333/33 |
| 5,391,516 A | * 2/1995 | Wojnarowski et al. | 438/612 |
| 5,410,179 A | * 4/1995 | Kornrumpf et al. | 257/638 |
| 5,970,319 A | * 10/1999 | Banks et al. | 438/115 |
| 6,251,488 B1 | 6/2001 | Miller et al. | |
| 6,268,584 B1 | 7/2001 | Keicher et al. | |

* cited by examiner

*Primary Examiner*—M. Alexandra Elve
(74) *Attorney, Agent, or Firm*—Pillsbury Winthrop LLP

(57) ABSTRACT

A method and system for electrically interconnecting a semiconductor device and a component is presented. The semiconductor device includes a dielectric portion on at least one face thereof. Similarly, the component includes a dielectric portion on at least one face thereof. The device and component are constructed and arranged to be stacked and bonded together. A first laser selectively ablates the respective dielectric portions of the device and component. The ablating creates a starting pad on the device or component and a destination pad on the device or component. A second laser deposits a conductor along a path between the starting pad and destination pad. As such, smaller, more condensed electronic packages may be fabricated.

17 Claims, 5 Drawing Sheets

METHOD AND SYSTEM TO MANUFACTURE STACKED CHIP DEVICES

BACKGROUND

1. Field

This invention relates generally to packaging of integrated circuits. More specifically, this invention relates to a method and system for electrically interconnecting semiconductor devices.

2. Background and Related Art

In electronic packages, semiconductor devices may be stacked together atop package substrates. FIG. 1 (Prior Art) illustrates a package 100. Package 100 is a stacked chip composite device that includes a substrate 101, a semiconductor die 110 stacked atop substrate 101, and a semiconductor die 120 stacked atop die 110. Solder bumps 150 are typically employed to assemble the stacked chip composite device to a printed wiring board (not shown). Each die 110, 120 and substrate 101 are electrically interconnected via wire bond technology. Specifically, each die 110, 120 is electrically connected to substrate 101 via gold wires 130. Die 110 and die 120 also may be electrically interconnected via gold wire connections (not shown). An encapsulant or mold 140 in package 100 protects gold wires 130.

In other arrangements (not shown), die 120 and substrate 101 are electrically interconnected via gold wires, and die 110 and substrate 101 are electrically interconnected using solder bumps. The entire package is then encapsulated with an encapsulant.

The inclusion of gold wires and encapsulants within packages such as package 100 leads to a large total package height, which places constraints on application design. Moreover, the inclusion of gold wires and encapsulants makes such packages relatively difficult and expensive to fabricate.

Therefore, what is needed is an improved method and system for electrically interconnecting semiconductor devices.

DETAILED DESCRIPTION

A method and system for electrically interconnecting a semiconductor device and a component, as disclosed herein, involve a semiconductor device and a component, such as another semiconductor device or a carrier substrate. The device and component include respective dielectric portions on at least one respective face thereof. The device and component are constructed and arranged to be stacked and bonded together. A first laser selectively ablates the respective dielectric portions of the device and component. The ablating creates a starting pad on the device or component and a destination pad on the device or component. A second laser deposits a conductor along a path between the starting pad and destination pad. In accordance with embodiments of the present invention, smaller, more condensed electronic packages may be fabricated, and gold wires and associated encapsulants may be eliminated from electronic package designs.

Figure 1:
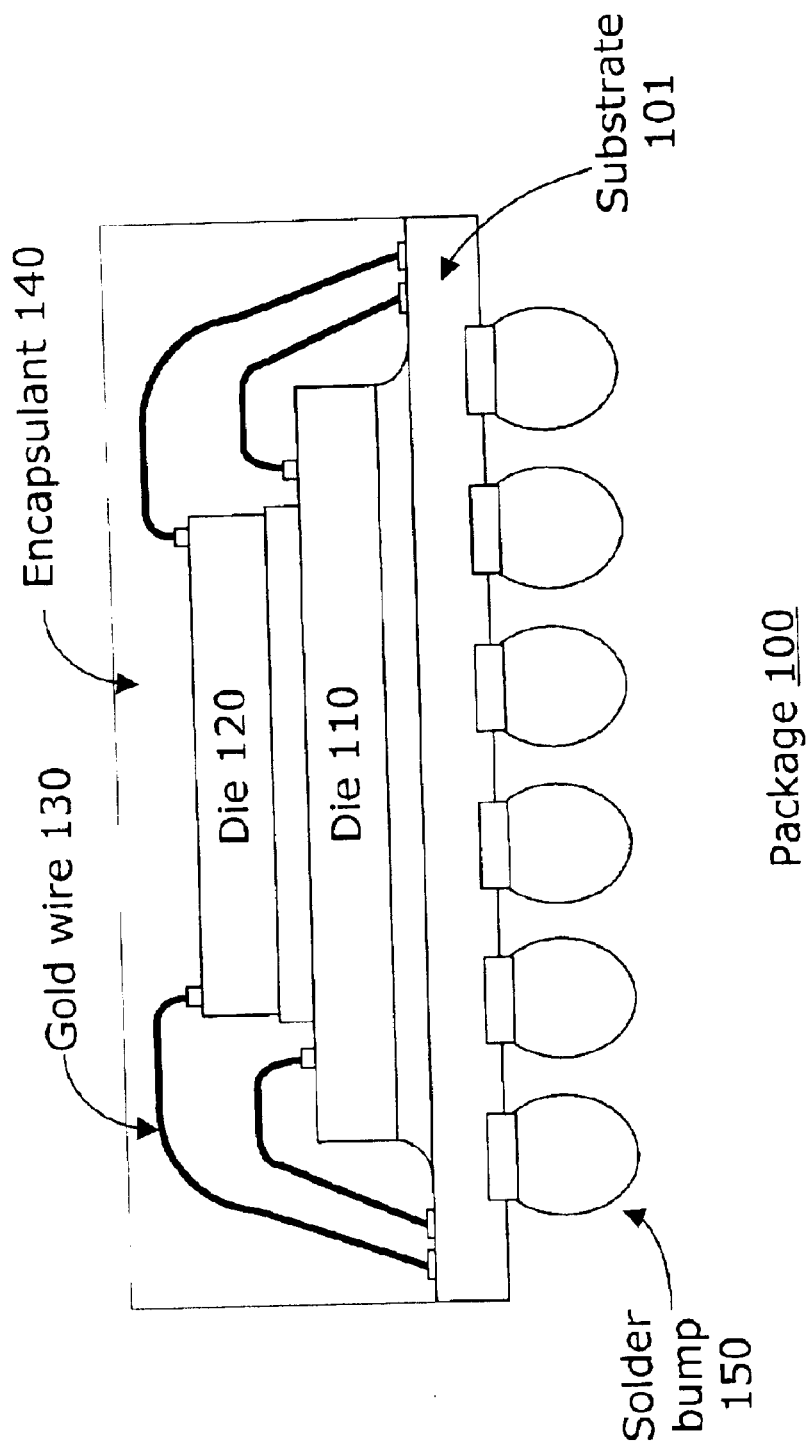
FIG. 1 (Prior Art) illustrates a package that includes gold wires and an encapsulant.
Figure 2:
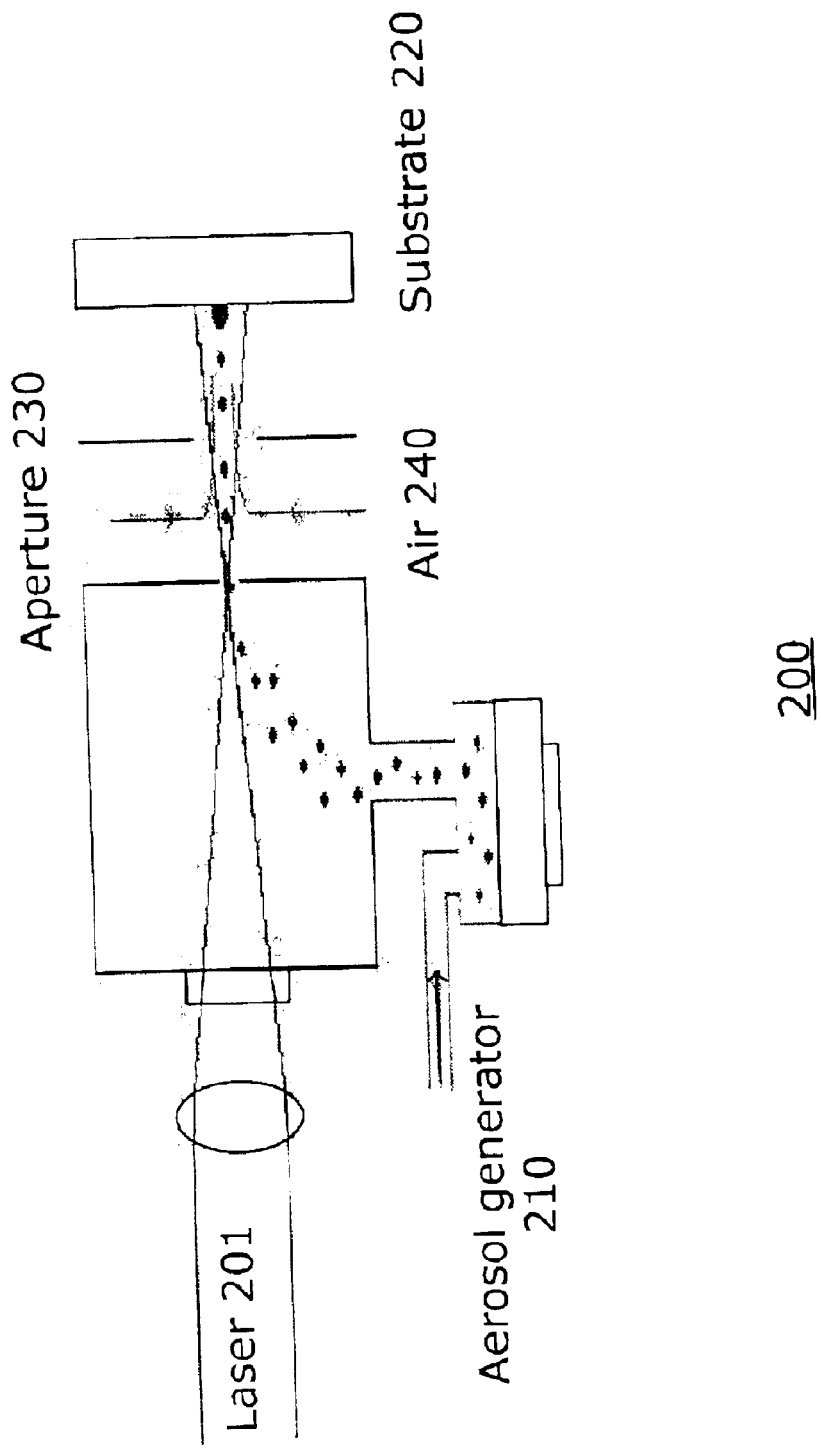
FIG. 2 (Prior Art) illustrates a system for depositing a conductor via a laser.

FIG. 2 (Prior Art) illustrates a system 200 in which a conductor is deposited onto an electrical device using the energy of a laser beam and conductor precursor chemistries. A laser beam, such as a laser 201, may ablate—that is, remove—dielectric material from a substrate 220 to prepare the substrate for conductor deposition. Laser 201 is then focused through an aperture 230. An aerosol generator 210 propels dissolved metal through aperture 230. The dissolved metal comes into contact with air 240 and is applied by laser 201 to substrate 220. In another system (not shown), a surface of a substrate is flooded with a solution, which a laser decomposes to generate a conductor.

Figure 3:
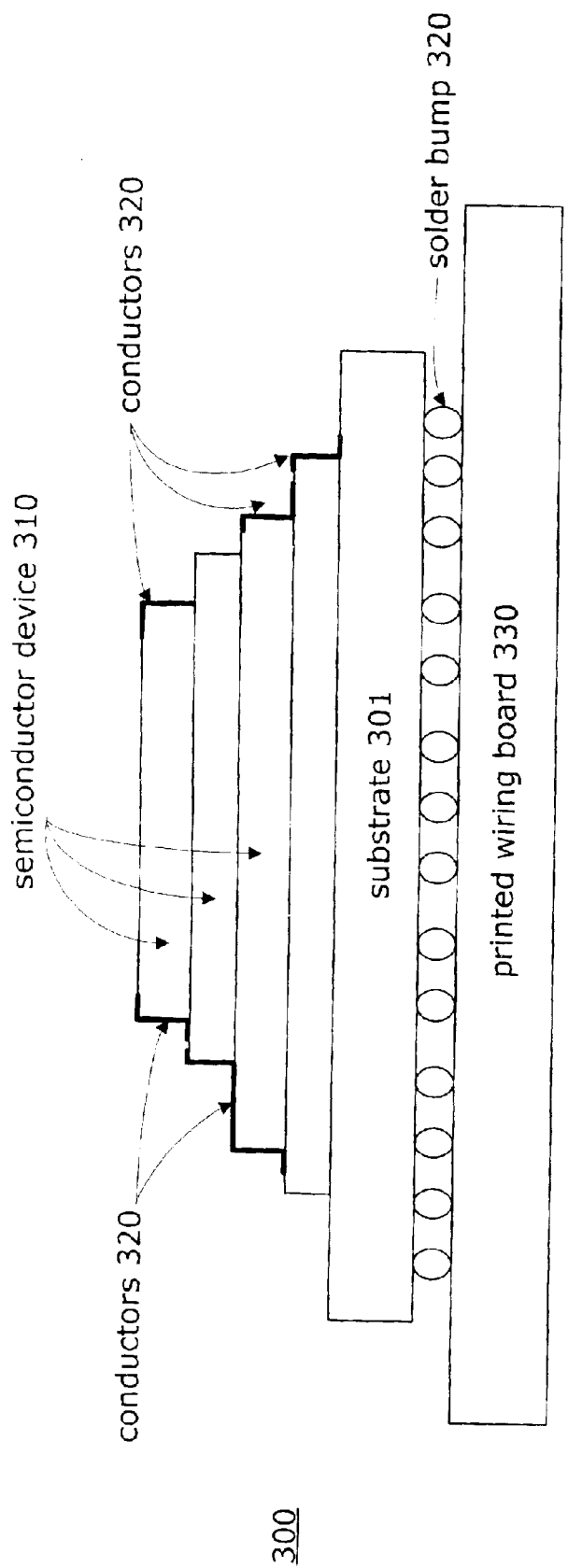
FIG. 3 illustrates a system that includes stacked semiconductor devices that are electrically interconnected according to an embodiment of the present invention.

FIG. 3 illustrates a system 300 of stacked, electrically interconnected semiconductor devices according to an embodiment of the present invention. System 300 includes various semiconductor devices 310 that are stacked and bonded together. Semiconductor devices 310 may be bonded and stacked together by artisans of ordinary skill in accordance with methods well known in the art. Semiconductor devices 310 may be stacked on a substrate 301, which is connected to a base printed wiring board or other interconnect device 330 via connection mechanisms, such as solder bumps 320.

Semiconductor devices 310 and substrate 301 may include a dielectric portion, such as a coating, on at least one face thereof. For instance, a top face of a semiconductor device 310 and an edge face thereof may include such an insulating coating. The dielectric portion may comprise, for example, silicon oxide (SiOx) or a polyimide-type polymeric compound. The dielectric portion insulates existing base material and circuitry of semiconductor devices 310 from laser-formed conductors, thus preventing short circuits.

In some embodiments, a dielectric material is applied to a semiconductor device, such as semiconductor device 310 in system 300. In other embodiments, a dielectric material need not be applied. For instance, a fabricated substrate, such as substrate 301, may include a dielectric material by design.

Each semiconductor device 310 is electrically connected, via laser-formed conductors 320, to another semiconductor device 310 and/or to a package substrate 301. Each conductor 320 may be deposited by a laser along a path that begins at a starting pad on one of the devices 310 and ends at a destination pad on another device or substrate 301.

To fabricate each conductor 320, a laser may selectively ablate respective dielectric portions of the semiconductor devices 310 that are to be electrically interconnected. Specifically, the ablating may create a starting pad on one such device and a destination pad on another such device. A laser may then deposit a conductor along a path between the starting pad and destination pad. The path may traverse, for instance, top surfaces and edges of semiconductor devices 310. In an exemplary implementation, laser control software may control the drawing of the path. In particular, such software may define the location of the starting pad, turn the laser on, move the laser or the bed on which the device is resting, stop the movement of the laser at the destination pad, and turn off the laser. For a subsequent conductor, the control software may then move the device or the laser to the next starting pad to begin the process again. It is to be appreciated that in some embodiments, the same laser or different lasers may be used for various processes, such as the ablation or deposition processes.

Connections between a device and the carrier substrate may enable signal transmission to and from other devices on printed wiring board 330. Moreover, wire bonding or encapsulants need not be employed in embodiments of the present invention. Thus, the overall height of the stacked semiconductor devices is reduced. The number of interconnections possible among semiconductor devices and/or a carrier substrate may depend on a number of factors, including the amount of surface area available in a given implementation, as well as the width of the laser beam employed in the assembly process.

Figure 4A:
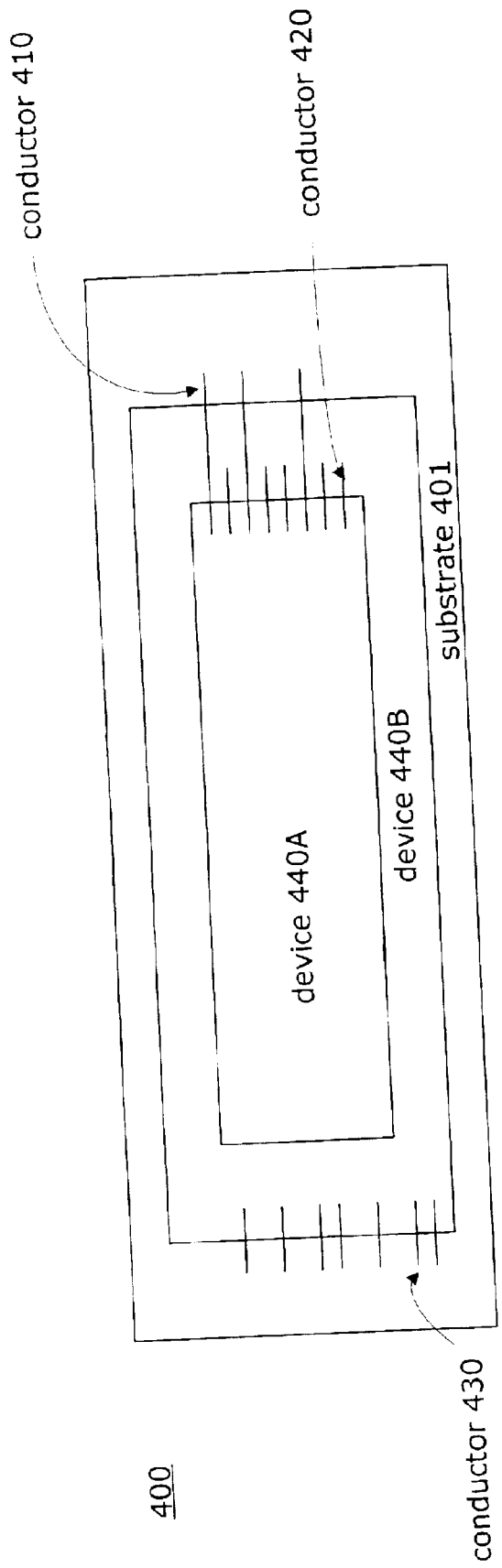
FIGS. 4A and 4B are top and side views, respectively, of stacked semiconductor devices that are electrically interconnected according to an embodiment of the present invention.
Figure 4B:
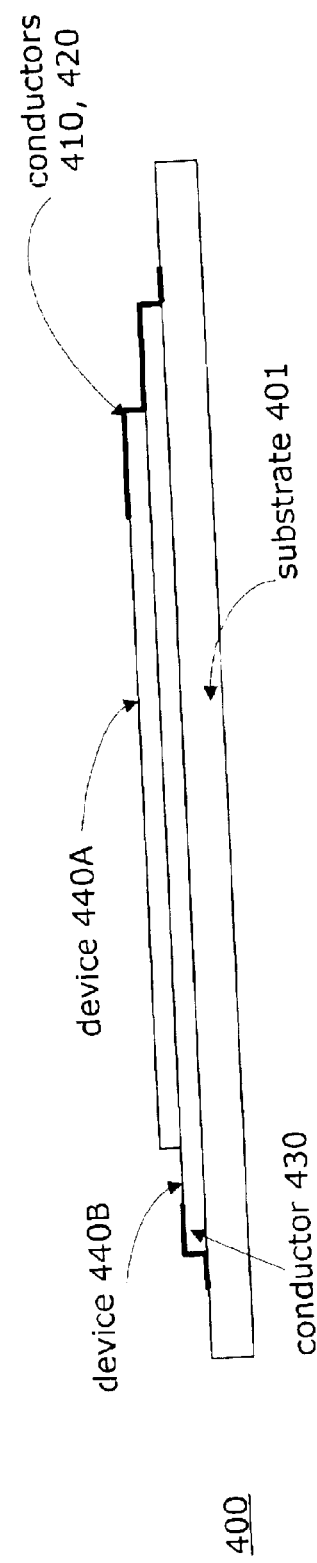

FIGS. 4A and 4B illustrate top and side views, respectively, of a system 400 according to an embodiment of the present invention. As shown, semiconductor devices 440A, 440B and substrate 401 are stacked together. Device 440A and device 440B are electrically interconnected via conductors 420, which are deposited with a laser. Device 440A and substrate 401 are electrically interconnected via conductors 410. Device 440B and substrate 401 are electrically interconnected via conductors 430. The height of such a stacked configuration is relatively small, and gold wire and encapsulant materials need not be incorporated into the design.

Figure 5:
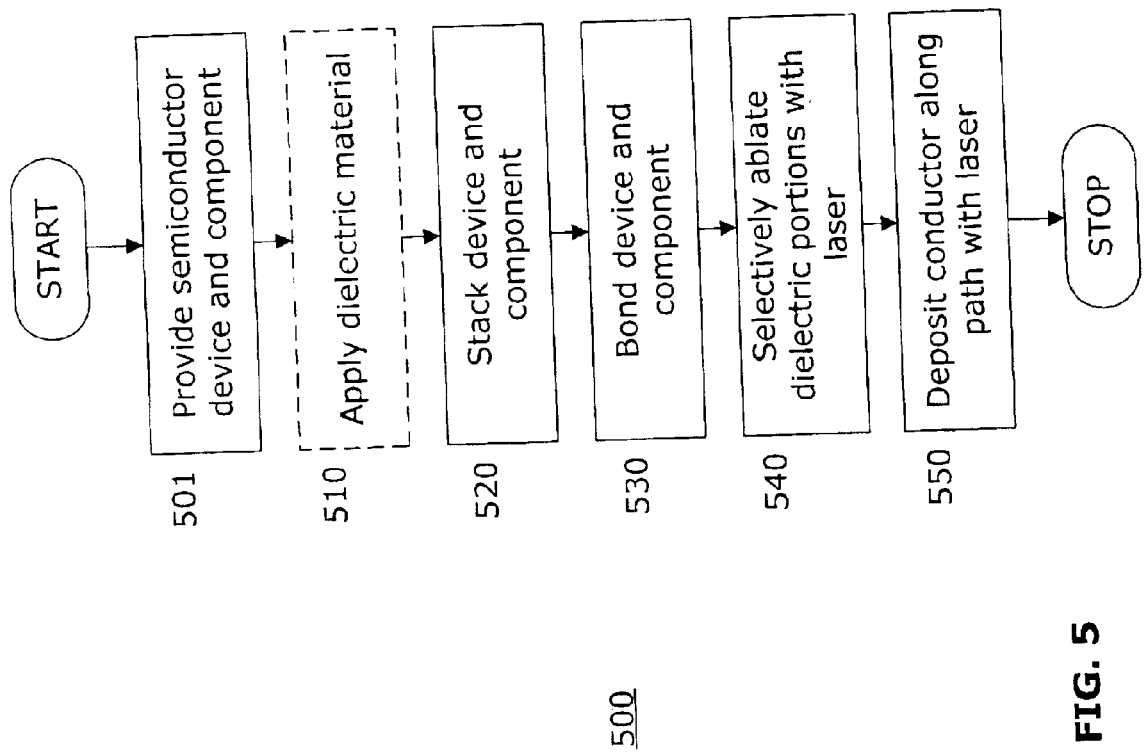
FIG. 5 is a high-level flow diagram illustrating a process for electrically interconnecting semiconductor devices according to an embodiment of the present invention.

FIG. 5 is a high-level flow diagram of a process 500 for electrically interconnecting semiconductor devices according to an embodiment of the present invention. In task 501, a semiconductor device and a component are provided. In task 510, a dielectric material is applied, if not already present, to the semiconductor device and component. The device and component are stacked and bonded in tasks 520 and 530, respectively, to provide mechanical interconnections therebetween. It is to be appreciated that various steps, such as stacking and bonding, may occur as one task or multiple tasks within an overall package assembly process.

In task 540, during a first scan, a laser selectively ablates dielectric material from the device and component to create a starting pad and a destination pad. The starting pad may reside on the device, and the destination pad may reside on the component. Alternatively, the starting pad may reside on the component, and the destination pad may reside on the device. In task 550, during a second scan, a laser deposits a conductor along a path between the starting pad and destination pad.

Though not shown in FIG. 5, process 500 may include a task wherein an assembly device locates at least two registration fiducials on the component and the device, and orients a laser or lasers based at least in part on the locating. It is to be appreciated that one laser or multiple lasers may be used for various tasks in process 500.

The foregoing description of the preferred embodiments is provided to enable any person skilled in the art to make or use the present invention. Various modifications to these embodiments are possible, and the generic principles presented herein may be applied to other embodiments as well. As such, the present invention is not intended to be limited to the embodiments shown above but rather is to be accorded the widest scope consistent with the principles and novel features disclosed in any fashion herein.

What is claimed is:

1. A method for electrically interconnecting a semiconductor device and a component, comprising:

providing the semiconductor device and the component, wherein the device includes a dielectric portion on at least one face thereof and the component includes a dielectric portion on at least one face thereof, and the device and component are constructed and arranged to be stacked and bonded together;

selectively ablating, by at least a first laser, the respective dielectric portions of the device and component, wherein the ablating creates a starting pad on one of the device and component and a destination pad on the other of the device and component; and depositing, by at least a second laser, a conductor along a path between the starting pad and the destination pad.

2. The method of claim 1, further comprising providing a second semiconductor device, wherein the device and component are interposed by the second device, and the second device is constructed and arranged to be stacked with and bonded to the device and component.

3. The method of claim 2, further comprising stacking the device, component, and second device.

4. The method of claim 2, further comprising bonding the device, component, and second device.

5. The method of claim 1, further comprising stacking the device and the component.

6. The method of claim 1, further comprising bonding the device and the component.

7. The method of claim 1, further comprising applying a dielectric material to the at least one face of the device.

8. The method of claim 1, wherein the dielectric portion of the device comprises silicon oxide (SiOx).

9. The method of claim 1, wherein the dielectric portion of the device comprises a polyimide-type polymeric compound.

10. The method of claim 1, wherein the at least one face of the device comprises a top face or an edge face.

11. The method of claim 1, wherein the component is a semiconductor device.

12. The method of claim 1, wherein the component is a carrier substrate.

13. The method of claim 1, wherein the device and component are constructed and arranged to be electrically interconnected exclusive of a wire bond interconnection.

14. The method of claim 1, wherein the device and component are constructed and arranged to be electrically interconnected exclusive of an encapsulant.

15. The method of claim 1, further comprising:

locating, by a laser assembly device, at least two registration fiducials on the component and device; and moving the at least first laser or the at least second laser based at least in part on the locating.

16. The method of claim 15, further comprising:

moving the at least first laser and the at least second laser based at least in part on the locating.

17. The method of claim 1, wherein the at least first laser and the at least second laser comprise a same laser.

* * * * *